| United States Patent [19] | [11] Patent Number: 4,892,612 |
| Huff | [45] Date of Patent: Jan. 9, 1990 |

[54] POLISHING METHOD

[76] Inventor: John E. Huff, 4102 W. Wagon Wheel Dr., Phoenix, Ariz. 85051

[21] Appl. No.: 255,801

[22] Filed: Oct. 11, 1988

[51] Int. Cl.$^4$ .......................... H01L 2/306; B44C 1/22
[52] U.S. Cl. ................... 156/636; 51/283 R; 51/317; 156/639; 156/645; 156/662; 156/903; 252/79.1; 252/79.5
[58] Field of Search ............... 156/636, 639, 645, 662, 156/903; 252/79.1, 79.5; 51/281 R, 317, 283 R

[56] References Cited

U.S. PATENT DOCUMENTS 3,429,080  2/1969  Lachapelle ........................... 51/309

Primary Examiner—William A. Powell
Attorney, Agent, or Firm—Ernest G. Posner; J. S. Stephen Bobb

[57] ABSTRACT

The process of polishing semiconductor materials such as silicon with a silica sol-amine combination is improved by selecting an alkanolamine as the amine. The alkanolamine can be added in higher proportions than the prior art suggests while maintaining a stable colloidal dispersion. The silica sol-alkanolamine combination can be diluted to extremely low silica contents while exhibiting a high pH and efficient polishing of silicon metal wafers.

7 Claims, No Drawings

POLISHING METHOD

BACKGROUND OF THE INVENTION

My invention relates to polishing materials such as silicon wafers generally used in producing semiconductors. In particular, my invention involves an improvement to the process of polishing silicon wafers with a polishing agent consisting of colloidal silica and an amine.

Silicon wafers sliced from single crystal ingots require several polishing steps to provide the flat defect-free surface required for further processing. Such polishing is best accomplished using any of several machines designed for the purpose and an aqueous slurry or dispersion of a polishing agent. The industry has preferred silica sol for polishing. Walsh and Herzog (U.S. Pat. No. 3,170,273), among others, teach the use of silica sols for the purpose. Payne in U.S. Pat. No. 4,169,337 discloses an improvement to this process by the inclusion of up to 5% of an amine in the sol. In U.S. Pat. No. 4,462,188 Payne discloses an improvement to his own process, said improvement consisting of the addition of a quaternary ammonium salt or base to the amine silica-sol combination. These teachings can be construed to provide a silica sol that contains up to 5% of an amine and up to 5% of said quaternary, these percentages being based on the $SiO_2$ in the sol.

The industry tends to practice the polishing process with sols such as those taught by Payne as follows. The sol is received at about 30 to 60% $SiO_2$ with the required amine added thereto. The sol is diluted to about 3% $SiO_2$ (10 to 20 times) with water. The pH of the diluted sol is adjusted to 10.5 to 11 with alkali metal or ammonium hydroxide as taught by Payne and others. Potassium hydroxide is preferred, although not ideal. NaOH and $NH_4OH$ have more distinct disadvantages. The higher pH is required to improve stock removal. See Basi, et al., U.S. Pat. No. 4,549,374. The sol should be used soon after dilution and pH adjustment, because the pH tends to drop on aging. The pH also decreases as polishing proceeds. Both these situations require that additional KOH be added to establish and/or sustain the desired stock removal rate.

Polishers would consider a sol-amine combination that requires only dilution avoiding pH monitoring and adjustment a distinct and valuable improvement to the process. To provide such a combination, additional alkaline materials would have to be added to the concentrated sol. Addition of substantial amounts of alkaline materials to concentrated sols has not been thought a reasonable approach, since the chemistry of silica sols does not encourage such additions. Silica sols that contain more than 20% $SiO_2$ are carefully balanced colloidal systems stabilized by a combination of structured water layers surrounding the silica particles and a limited number of counter ions. The addition of alkaline bases or salts destabilizes these sols by disrupting the structured water layers and by the alkali attacking the silica polymer. These conditions cause the sol to become progressively more viscous and finally to gel.

It is an object of this invention to improve the polishing of silicon metal wafers by employing a silica sol-amine combination that contains sufficient amine to provide a high pH on dilution and that said silica sol-amine combination is stable. It is a further object of this invention to eliminate addition of alkali metal prior to and during the polishing process. The alkali metal present is thereby limited to any that is required during sol preparation.

SUMMARY OF THE INVENTION

I have found that the process of polishing silicon wafers with combinations of amines and silica sol can be significantly improved by selecting only from the group of alkanolamines and introducing at least twice as much of said amine as taught or suggested by the prior art. The amine is selected from the water-soluble members of the group of alkanolamines and is added to the silica sol in an amount to provide at least 2 parts by weight (pbw) of said amine for each 10 pbw of silica dispersed in the sol. The silica sol-alkanolamine combination is stable upon preparation and storage. It need only be diluted to provide a polishing dispersion that contains 3% $SiO_2$ or less, and provides performance better than that provided by prior-art materials. The resulting pH is sufficient to effect efficient stock removal with no additional alkali required. The pH of the diluted material becomes stable after a short period and does not decrease significantly on storage or use of the diluted material. The examples will show that prior-art and other competitive materials must be adjusted to a pH value that is necessary for rapid stock removal by the addition of an inorganic alkali—KOH was used. In addition, the performance of my combination when diluted to considerably less than 3% $SiO_2$ is unusual in that the stock removal rate drops only slightly.

THE INVENTION

Silica sols are aqueous dispersions of dense silica particles of colloidal particle size. Essentially the silica is insoluble in water, but the particles are of colloidal dimensions, 2 to about 100 nm (nanometers), and, as such, form stable dispersions, provided that suitable amounts of counter ions are present. Such sols are articles of commerce and can be prepared in numerous ways, the most common being the alkaline stabilization of de-alkalized sodium silicate as described by Bird (U.S. Pat. No. 2,244,325), Bechtold and Snyder (U.S. Pat. No. 2,574,902), and Weldes, Boyle and Bobb (U.S. Pat. No. 3,440,175). Silica sols can also be prepared by the decomposition of silicon metal in alkaline materials as described by Bobb (U.S. Pat. No. 3,650,977) wherein alkali metal hydroxides are used to catalyze the reaction of finely-divided silicon or ferrosilicon in water. Amines can also be used to catalyze the reaction as described in U.S. Pat. Nos. 2,614,993; 2,614,994; and 2,614,995 to provide sols that contain no alkali metal. Commercially available sols containing 20 to about 60% by weight $SiO_2$, have about 50 to 200 moles of $SiO_2$ for each mole of $M_2O$, wherein M is usually sodium, but can be potassium, and the average particle size of the silica sol is about 5 to 80 nm, usually about 15 to 60 nm.

The alkanolamines used in the improved process of my invention are any water-soluble amine of the class that has at least one OH group for each nitrogen. Examples include, but are not limited to methanolamine, ethanolamine, propanolamine, diethanolamine, triethanolamine, and the like. Ethanolamine is sometimes called monoethanolamine.

The alkanolamine is added slowly to the silica sol with agitation sufficient to prevent any localized gelling and/or coacervation. The amount of amine added should provide a pH of at least about 10.5 when the silica sol-amine combination is diluted to about 3% SiO$_2$. I have found that at least about 2 pbw of alkanolamine for each 10 pbw of SiO$_2$ in the sol is effective. More amine can be added so that there would be considerably more than 2 pbw of amine for each 10 pbw of SiO$_2$. I prefer a combination that contains about 8 to 10 pbw of alkanolamine for each 10 pbw of SiO$_2$ and I most prefer a combination that contains about 10 pbw of alkanolamine for each 10 pbw of SiO$_2$. I prefer the alkanolamine to be monoethanolamine.

The improved process of my invention is carried out as follows. The silica sol-alkanolamine combination is about 3% SiO$_2$. Dilutions to less than 3%, such as about 1% SiO$_2$, are acceptable. The diluted materials exhibit a pH in excess of about 10.5 and usually a pH of more than about 11.0. The diluted combination may be used to polish silicon wafers in commercial polishing machines. No adjustment of the pH is required during polishing to maintain the desired stock removal rate. The diluted sol-alkanol combination need not be used at once, since the pH does not decrease significantly on aging. The colloidal dispersion is used in any of several commercial polishing machines as the polishing agent. The stock removal rates and the surface realized using this material are excellent. After polishing, the silicon wafers need only be rinsed before further processing.

EXAMPLES

The following examples illustrate certain embodiments of my invention. These examples are not provided to establish the scope of the invention, which is described in the disclosure and recited in the claims. The proportions are in parts by weight (pbw), percent by weight (% wt/wt), percent by volume (% v/v) or parts by volume (pbv), unless otherwise indicated.

A standard polishing machine manufactured by the Strasbaugh Company commonly used for the commercial polishing of semiconductor wafers was used to polish silicon wafers using the silica sol-amine combinations of my invention. Commercially available silica sols of various particle sizes were combined with monoethanolamine at various concentrations, then diluted and used in the said polishing machine with different types of silicon wafers and at varying conditions.

EXAMPLE 1

A combination containing 3.58 pbw of monoethanolamine for each 10 pbw of SiO$_2$ was prepared, diluted and used to polish 3-inch, 111 type silicon wafers. The particle size of the sol was mixed, and it contained particle sizes from 8 nanometers (nm) to 100 nm. The polishing pad was Suba #10, the pressure 4.75 pounds per square inch (psi), the flow rate was 2 gal/hr. The results of the polishing runs are summarized in Table 1.

TABLE 1

| Run # | SiO$_2$ (% wt/wt) | Temp (°F.) | Stock Removal (mils/min) |
|---|---|---|---|
| 1 | 3.0 | 129 | 0.073 |
| 2 | 3.0 | 130 | 0.077 |
| 3 | 1.5 | 134 | 0.055 |

The surface of the polished wafers was acceptable, exhibiting no undesirable haze.

EXAMPLE 2

A combination containing 2.48 pbw of monoethanolamine for each 10 pbw of SiO$_2$ was prepared, diluted and used to polish 3-inch, 100 type silicon wafers. The particle size of the sol was 40 nm. The polishing conditions were the same, except that the pressure was 9.4 psi. The results of the polishing runs are summarized in Table 2.

TABLE 2

| Run # | SiO$_2$ (% wt/wt) | Temp (°F.) | Stock Removal (mils/min) |
|---|---|---|---|
| 1 | 3.4 | 110 | 0.071 |
| 2 | 3.4 | 123 | 0.080 |
| 3 | 3.4 | 114 | 0.082 |
| 4 | 3.4 | 114 | 0.133 |
| 5 | 3.4 | 113 | 0.103 |
| 6 | 3.4 | 110 | 0.119 |

EXAMPLE 3

In this set of polishing runs, a Jade Multiple Head type achine was used to polish 3-inch, 100 type silicon wafers. The silica sol-amine combination contained 10.58 pbw of monoethanolamine for each 10 pbw of SiO$_2$. The average particle size of the SiO$_2$ was 40 nm. The polishing pad was Suba #10, flow rate was 1 gal/min, and the pressure 7.6 psi. The results of the polishing runs are summarized in Table 3.

TABLE 3

| Run # | SiO$_2$ (% wt/wt) | Temp (°F.) | Stock Removal (mils/min) |
|---|---|---|---|
| 1 | 1.0 | 103 | 0.093 |
| 2 | 1.0 | 105 | 0.087 |
| 3 | 1.0 | 108 | 0.099 |
| 4 | 1.0 | 110 | 0.099 |
| 5 | 1.0 | 108 | 0.105 |

The amount of haze on the polished, rinsed wafers was acceptable.

EXAMPLE 4

The silica sol-amine combination and polishing conditions were the same as described in Example 3, except the combination was further diluted and the polishing pressure was 10 psi. The results of the polishing runs are summarized in Table 4.

TABLE 4

| Run # | SiO$_2$ (% wt/wt) | Temp (°F.) | Stock Removal (mils/min) |
|---|---|---|---|
| 1 | 0.5 | 125 | 0.067 |
| 2 | 0.5 | 125 | 0.100 |
| 3 | 0.5 | 125 | 0.059 |
| 4 | 0.5 | 125 | 0.060 |
| 5 | 0.5 | 125 | 0.063 |

EXAMPLE 5

The pH values of the silica sol-alkanolamine combination of my invention and several prior-art and competitive materials were determined upon dilution to several levels. The dilutions were 20, 30, 40 and 60 pbv of water for each pbv concentrate. The results are summarized in Table 5.

TABLE 5

| Material | pH Prior to Dilution | Initial pH upon Dilution | | | |
|---|---|---|---|---|---|
| | | 20:1 | 30:1 | 40:1 | 60:1 |
| Invention | 12.0 | 11.00 | 11.00 | 11.00 | 10.50 |
| A | 11.0 | 9.50 | 9.15 | — | — |
| B | 11.0 | 9.75 | 9.70 | — | 9.50 |

TABLE 5-continued

| Material | pH Prior to Dilution | Initial pH upon Dilution | | | |
|---|---|---|---|---|---|
| | | 20:1 | 30:1 | 40:1 | 60:1 |
| C | 10.5 | 10.00 | 9.75 | — | 9.25 |
| D | 10.7 | 9.50 | 9.25 | — | 9.25 |

"Invention" is a combination according to my invention with a $SiO_2$ particle size of 40 nm, a silica content of 40% wt/wt and 3.3 pbw of monoethanolamine for each 10 pbw of $SiO_2$.
"A" is a silica sol containing about 50% $SiO_2$ and less than about 5% of an amine, 1 pbw of amine for each 10 pbw of $SiO_2$.
"B" is a silica sol that contains about 50% $SiO_2$ and about 3% of an amine; 0.6 pbw of amine for each 10 pbw of $SiO_2$.
"C" is a silica sol that contains about 30% $SiO_2$ and no amine.
"D" is an alumina-modified silica sol of about 35% $SiO_2$ and $Al_2O_3$ wherein the surface of said sol is modified with aluminate ions.

These results indicate that the prior-art products (A to D) do not provide pH values that are high enough to provide rapid stock removal upon dilution to the usual polishing levels. These results show why the prior-art teachings such as Payne, U.S. Pat. Nos. 4,169,337 and 4,462,188 require the use of KOH to adjust the pH to about 11 after dilution and during polishing operations.

In contrast, the silica sol-alkanolamine combination of my invention provides pH values sufficient for efficient polishing with no additional alkalies even when very highly diluted.

EXAMPLE 6

The pH values of the various dilutions of the sol-amine combinations of my invention were determined as a function of time. The material prior to dilution had 40% $SiO_2$, 3.3 pbw of monoethanolamine for each 10 pbw of $SiO_2$ and a particle size of 40 nm. The results are summarized in Table 6.

These results indicate that the diluted sol-amine combination of my invention provides a high and stable pH that is high enough to provide good polishing even at very great dilutions.

TABLE 6

| Dilution | pH at Time after Dilution (hours) | | | | | | | | |
|---|---|---|---|---|---|---|---|---|---|
| | 0 | 5 | 10 | 15 | 20 | 25 | 30 | 35 | 40 |
| 20:1 | 11.00 | 10.75 | 10.65 | 10.65 | 10.65 | 10.65 | 10.65 | 10.62 | 10.60 |
| 30:1 | 11.00 | 10.75 | 10.70 | 10.65 | 10.65 | 10.65 | 10.65 | 10.62 | 10.50 |
| 40:1 | 11.00 | 10.50 | 10.50 | 10.50 | 10.50 | 10.50 | 10.50 | 10.50 | 10.50 |
| 60:1 | 10.50 | 10.50 | 10.50 | 10.25 | 10.25 | 10.25 | 10.25 | 10.25 | 10.25 |

I claim:

1. In the method of polishing the surfaces of silicon wafers sliced from single crystal ingots with a silica sol-amine combination, the improvement comprising selecting the amine from the group of water-soluble alkanolamines, providing sufficient amine so that at least 2.0 pbw are present for each 10 pbw of $SiO_2$ and adding no alkali metal hydroxide or ammonium hydroxide to said silica sol-alkanolamine combination upon dilution or during polishing.

2. The method of claim 1 wherein the alkanolamine is selected from the group of monoethanolamine, diethanolamine, triethanolamine, methanolamine, propanolamine and mixtures thereof.

3. The method of claim 2 wherein the alkanolamine is monoethanolamine.

4. The method of claim 2 wherein the silica sol-alkanolamine combination contains 2.48 to 10.58 pbw of monoethanolamine for each 10 pbw of $SiO_2$.

5. In the method of polishing the surfaces of silicon wafers sliced from single crystal ingots using a polishing machine with a silica sol-amine combination, the improvement comprising:
 (a) combining an alkanolamine with a silica sol that contains about 20 to 60% by weight of $SiO_2$, has 50 to 200 moles of $SiO_2$ per mole of $M_2O$ wherein is sodium or potassium and has an average particle size of 5 to 80 nanometers (nm), thereby forming a stable silica sol-alkanolamine combination, said alkanolamine being selected from the group consisting of methanolamine, ethanolamine (monoethanolamine), propanolamine, diethanolamine, triethanolamine and sufficient alkanolamine being added to provide at least two parts by weight of said amine for each 10 parts by weight of $SiO_2$;
 (b) diluting said silica sol-alkanolamine combination with water to provide a pH of about 10.5 or more and a $SiO_2$ concentration of about 3% by weight or less, said dilution being carried out without the addition of alkali metal or ammonium hydroxide; and
 (c) using said diluted silica sol-alkanolamine combination in said polishing machine without adding alkali metal or ammonium hydroxide.

6. The method of claim 5 wherein the alkanolamine is monoethanolamine and said silica sol-alkanolamine contains about 8 to 10 parts by weight of amine for each 10 parts by weight of $SiO_2$.

7. The method of claim 5 wherein the silica sol-alkanolamine combination contains 2.48 to 10.58 parts by weight of monoethanolamine to 10 parts by weight of $SiO_2$.

* * * * *